United States Patent
Wong et al.

(10) Patent No.: US 6,798,249 B2
(45) Date of Patent: Sep. 28, 2004

(54) CIRCUIT FOR ASYNCHRONOUS RESET IN CURRENT MODE LOGIC CIRCUITS

(75) Inventors: Tak Ying Wong, Singapore (SG); David Ho, Singapore (SG); Wee Teck Lee, Singapore (SG); Khim Leng Low, Singapore (SG)

(73) Assignee: Broadcom Corporation, Irvine, CA (US)

( * ) Notice: Subject to any disclaimer, the term of this patent is extended or adjusted under 35 U.S.C. 154(b) by 66 days.

(21) Appl. No.: 10/303,974

(22) Filed: Nov. 26, 2002

(65) Prior Publication Data

US 2004/0100307 A1 May 27, 2004

(51) Int. Cl.[7] ............................................. H03K 19/094
(52) U.S. Cl. ........................ 326/115; 326/126; 326/127
(58) Field of Search ................................ 326/115, 126, 326/127; 327/99, 112, 199, 214, 408, 512, 538

(56) References Cited

U.S. PATENT DOCUMENTS

| | | | | |
|---|---|---|---|---|
| 4,628,217 A | * | 12/1986 | Berndt | 326/48 |
| 5,041,740 A | * | 8/1991 | Smith | 327/212 |
| 5,216,295 A | * | 6/1993 | Hoang | 326/115 |
| 6,614,291 B1 | * | 9/2003 | Zhao et al. | 327/408 |

OTHER PUBLICATIONS

Horowitz, M., "Current Mode Logic and Sense Amplifiers", Computer systems Laboratory Stanford University, EE 313, Lecture 14, publisher and publication date unknown, 11 pages.

Musicar, J.M. and Rabaey, J., "MOS Current Mode Logic for Low Power, Low Noise CORDIC Computation in Mixed-Signal Environments," University of California at Berkely, Berkely Wireless Research Center, publisher and publication date unknown, pp. 102–107.

* cited by examiner

Primary Examiner—Vibol Tan
(74) Attorney, Agent, or Firm—Sterne, Kessler, Goldstein & Fox, PLLC

(57) ABSTRACT

A current mode logic (CML) flip flop includes a first CML latch and a second CML latch. A plurality of pull-up switches are responsive to a reset signal. Outputs of the first and second CML latches are pulled up to a supply voltage through the pull-up switches. The first CML latch includes a first pull-up isolation switch driven by the reset signal for resetting the latch.

16 Claims, 22 Drawing Sheets

CIRCUIT FOR ASYNCHRONOUS RESET IN CURRENT MODE LOGIC CIRCUITS

BACKGROUND OF THE INVENTION

1. Field of the Invention

The present invention relates to current mode logic circuits, and more particularly, to a method and circuit for resetting current mode logic circuit elements that have a memory and/or initial state.

2. Related Art

Current mode logic (CML) is widely used to build high speed logic blocks, such as frequency dividers in PLLs and high speed serial link transceiver circuits. CML logic can operate two to three times faster than CMOS logic. For frequency dividers and counters, there is often a need to implement a reset to enable initialization of a defined state. In CMOS logic, this is done by using the resetable flip flops, which are typically implemented by having pull-up or pull-down transistors enabled in the reset state. Since CMOS logic is a complementary-type logic, where one path is turned ON and the other OFF, it is straightforward to use pull-up, pull-down and pass switch transistors to implement the reset. In CML, latches are realized using biased differential transistor pairs and crossover switches, and, unlike CMOS latches, speed and bias requirements do not easily allow a reset to be done by using pass transistors switches with pull-ups and pull-downs. A reset method commonly used in CML is described below.

In conventional art, which is illustrated by a divide-by-N circuit of FIGS. 1–7, a multiplexer 101 provides the initial state of the divide-by-N, and the reset mechanism is done sequentially from the input (vip, vin) to the output (vop, von). This is illustrated in FIGS. 1–7. The conventional CML divide-by-N circuit with an asynchronous reset shown in FIG. 1 consists of three blocks:

N CML flip flops 103A–103N are connected in series. Each CML flip flop 103 (illustrated in detail in FIG. 2) has two series-connected latches 201A, 201B and each latch 201A, 201B (illustrated in detail in FIG. 3) has NMOS differential transistor pair M301, M302, NMOS cross-coupled transistor pair M303, M304, NMOS transistor switches M305, M306, NMOS current source M307 and resistors R301, R302.

CML combination logic 102 (illustrated in detail in FIG. 4), includes NAND, NOR and MUX gates, and sets a duty cycle of divide-by-N circuit output.

CML multiplexer 101 (see FIG. 5) has NMOS differential transistor pairs M501–M502, M503–M504, NMOS transistor switches M505, M506, NMOS current source M507 and resistors R501, R502. Multiplexer 101 with one input connected to (VSS, VDD) provides the initial state and isolates the unknown input signal disturbing the reset process when reset is positive.

FIG. 2 shows a structure of CML flip flop 103. As shown in FIG. 2, CML flip flop 103 includes two CML latches 201A, 201B connected in series. CML latch 201A has inputs (vip, vin), and outputs (vop, von) which are inputted into corresponding inputs (vip, vin) of the second CML latch 201B. Both latches 201A, 201B have common clock inputs (clk, clkn).

FIG. 3 shows a structure of a CML latch 201 of FIG. 2. As shown in FIG. 3, CML latch 201 has a differential transistor pair M301, M302, whose gates are driven by (vip, vin) respectively. CML latch 201 also has an NMOS cross coupled transistor pair M303, M304. Drains of transistors M301, M302, M303 and M304 are tied to VDD through pull-up resistors R301, R302. Sources of the differential transistor pair M301, M302 are tied to a switch transistor M305, whose gate is driven by clock input clkn. Sources of cross-coupled transistor pair M303, M304 are tied to a drain of transistor switch M306, whose gate is driven by clock input clk. Current source transistor M307, whose gate is biased by voltage vb, supplies current to sources of switch transistors M305, M306. Latch 201 produces outputs (vop, von) as shown in FIG. 3.

FIG. 4 shows a circuit diagram of CML combination logic 102 of FIG. 1. As shown in FIG. 4, CML combination logic 102 includes four differential transistor pairs (M401, M402), (M403, M404), (M405, M406), (M407, M408), and (M409, M410) forming NAND and MUX gates. Switches M411, M412, and M413 are connected to sources of respective differential transistor pairs, as shown in FIG. 4. Tail current source transistors M414 and M415 supply current to the differential transistor pairs. Power supply voltage VDD is provided through pull-up resistors R401–R402, R403–R404, and outputs (vop, von) are connected to the pull-up resistors R403–R404 as shown in FIG. 4. The "sel" signal is an internal signal of CML combination logic 102, and can be connected to power or ground. It sets the first output of (vop, von) to be logic "1" or "0" for duty cycle setting after reset and the "sel" setting is up to the user. Note that it does not affect the reset operation.

FIG. 5 illustrates the circuit diagram of CML multiplexer 101. As shown in FIG. 5, CML multiplexer 101 includes two differential transistor pairs (M501, M502) and (M503, M504). Tail current source transistor M507 supplies current to sources of the differential transistor pairs (M501, M502) and (M503, M504) through switch transistors M505, M506. Switch transistors M505, M506 are driven by a reset and resetn (inverted reset) signal, respectively. Drains of differential transistor pairs (M501, M502), (M503, M504) are connected to the supply voltage VDD through pull-up resistors R501, R502, respectively, and to outputs (vop, von), respectively, as shown in FIG. 5.

To understand the reset operation of divide-by-N circuit, a reset of divide-by-2 is shown in FIG. 6 and is explained using the timing diagram of FIG. 7. First, the input (VSS, VDD) of multiplexer 101 is selected by reset. Second, the output (VSS, VDD) of multiplexer 101 is asserted at the input (vip, vin) of CML flip flop 103, and is read by the NMOS differential transistor pair M301, M302 of first CML latch 201A at a negative clock (clk) period (clk=LOW). Third, the output (VSS, VDD) of first CML latch 201A is held by NMOS cross-coupled transistor pair M303, M304 of first CML latch 201A of CML flip flop 103, and is read by the NMOS differential transistor pair M301, M302 of second CML latch 201B of CML flip flop 103 to the output (VSS, VDD) at the positive clk period (clk=HIGH). Fourth, the output (VSS, VDD) is held by NMOS cross-coupled transistor pair M303, M304 of second CML latch 201B at the negative elk period (clk=LOW). As a result, the output of CML flip flop 103 is reset to the initial state (VSS, VDD) at the second negative elk period (clk=LOW).

Since the conventional circuit resets (vip, vin), (qop, qon) and (vop, von) sequentially, its minimum reset duration must take slightly more than one clock period. For convenience, assume that one clock period is required for reset. Thus, the reset operation of a conventional divide-by-N is such that all the outputs of CML flip flops 103 are reset to the defined value (VSS, VDD) at one clock period.

The disadvantages of the conventional CML divide-by-N with asynchronous reset are as follows:

In a convention reset circuit, multiplexer 101 is used to define an initial state of the circuit. Multiplexer 101 introduces a delay when it is not being used (i.e. when no reset is applied to the circuit), however, the multiplexer is always in the signal path, introducing a delay. CML multiplexer 101 with a propagation delay ($t_d$) requires the minimum pulse width to be $t_d+t_{setup}+t_{hold}$. For example, $t_d$ is 40 ns in the 1.2V 3.125 GHz Serdes standard, and it is 12.5% of full speed clock 3.125 GHz. As operational speed increases, the propagation delay $t_d$ becomes a bottleneck.

Extra current consumption $I_{MUX}$ is needed for multiplexer 101 that provides the initial state. There is a dependence between the extra current consumption $I_{MUX}$ and the reset duration. If each CML flip flop 103 has its own multiplexer 101, then the current consumption is increased by $N \times I_{MUX}$, but the reset duration stays at one clock period. Even if only the first CML flip flop 103 has its own multiplexer 101, the current consumption is slightly increased by $I_{MUX}$, but the reset duration is increased to N clock periods.

The reset duration takes at least one clock period. For example, if clk is 1/20 of full speed (system) clock, then the latency is a significant number of 20 UI (unit intervals).

Thus, conventional asynchronous reset circuits are unsuitable for low-power very-high-speed applications.

BRIEF SUMMARY OF THE INVENTION

Accordingly, the present invention is directed to a circuit for asynchronous reset in current mode logic circuits that substantially obviates, one or more of the disadvantages of the related art.

There is provided a current mode logic (CML) flip flop including a first CML latch and a second CML latch. A plurality of pull-up switches are responsive to a reset signal. Outputs of the first and second CML latches are pulled up to a supply voltage through the pull-up switches. The first CML latch includes a first pull-up isolation switch driven by the reset signal for resetting the latch.

In another aspect there is provided a CML divide-by-N circuit including N CML flip flops connected in series, each flip flop inputting (vip, vin) signals and outputting (vop, von) signals. Each flip flop includes a first CML latch and a second CML latch. The first CML latch includes a first pull-up isolation switch driven by the reset signal for resetting the latch. A plurality of pull-up switches are driven by a reset signal. Outputs of the first and second CML latches are pulled up to a supply voltage through the pull-up switches. Combination logic inputs the (vip, vin) signals and outputs the (vop, von) signals to set a duty cycle of the divide-by-N circuit.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Figure 1:
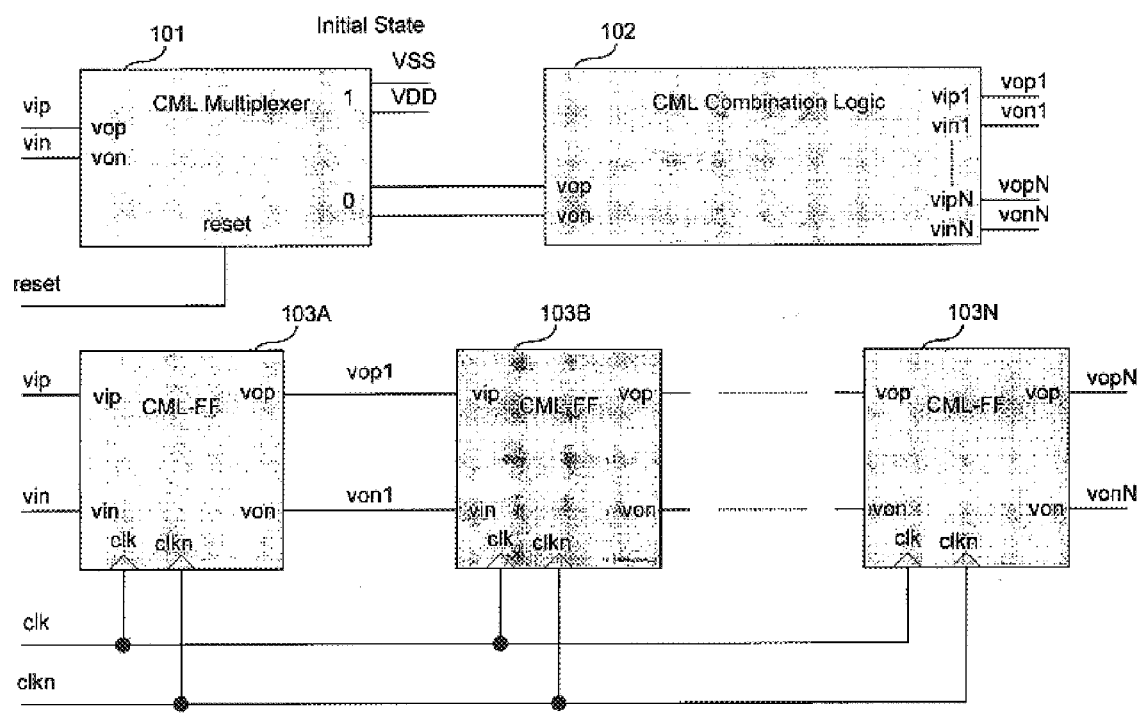
FIG. 1 shows a conventional CML divide-by-N circuit with one multiplexer at a first CML flip flop.
Figure 2:
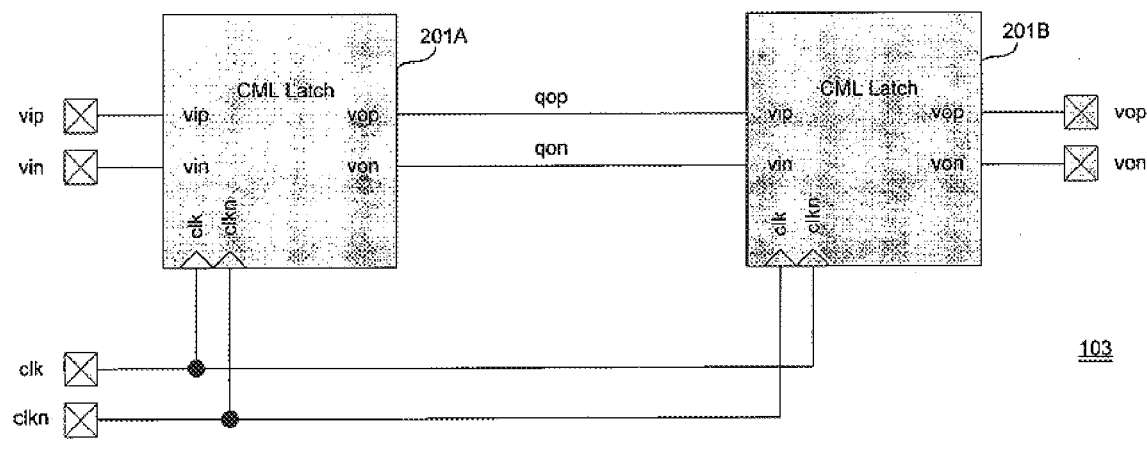
FIG. 2 illustrates a conventional CML flip flop.
Figure 3:
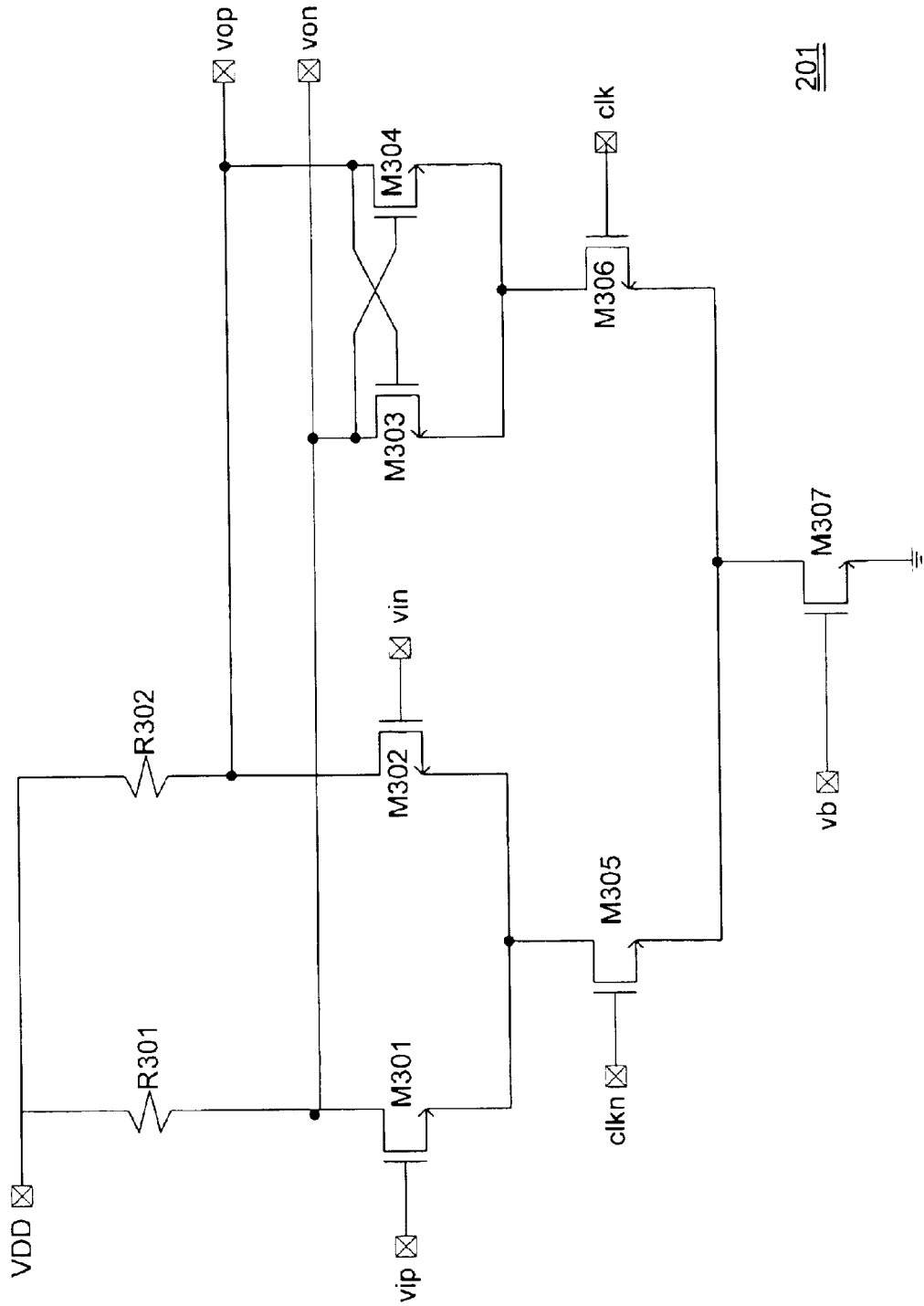
FIG. 3 illustrates a conventional CML latch.
Figure 4:
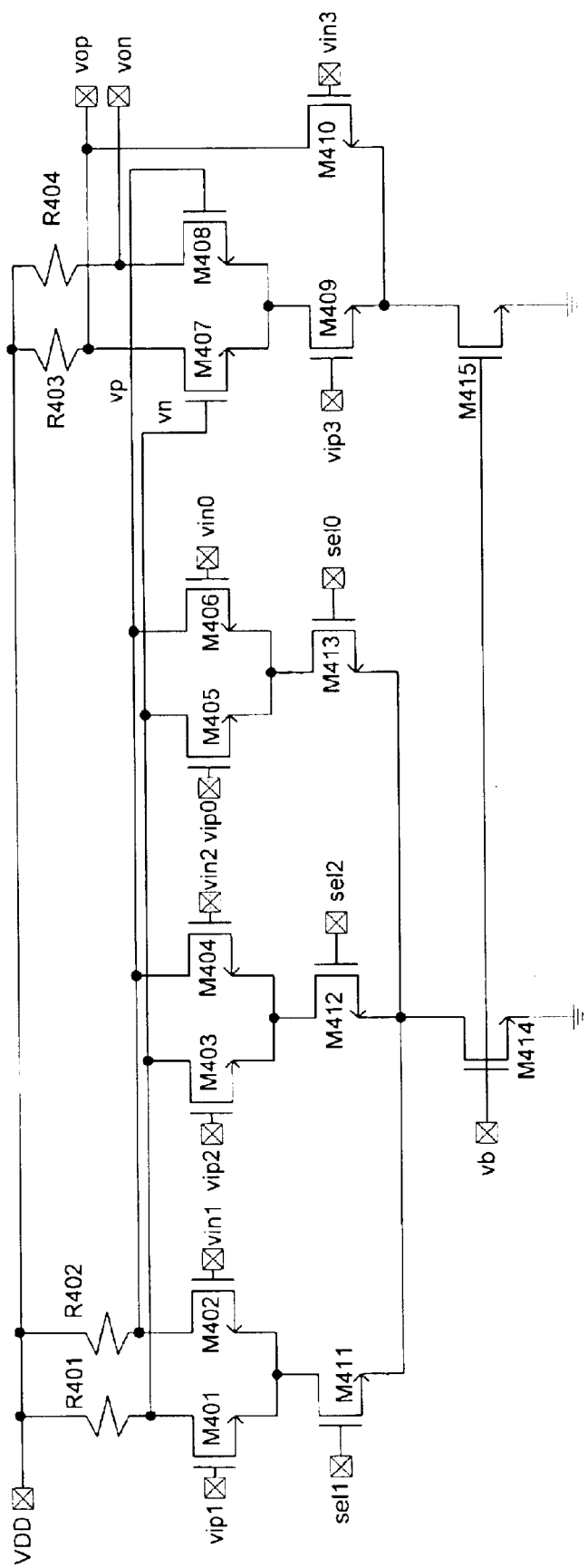
FIG. 4 illustrates a conventional combination logic for use with a divide-by-N circuit of FIG. 1.
Figure 5:
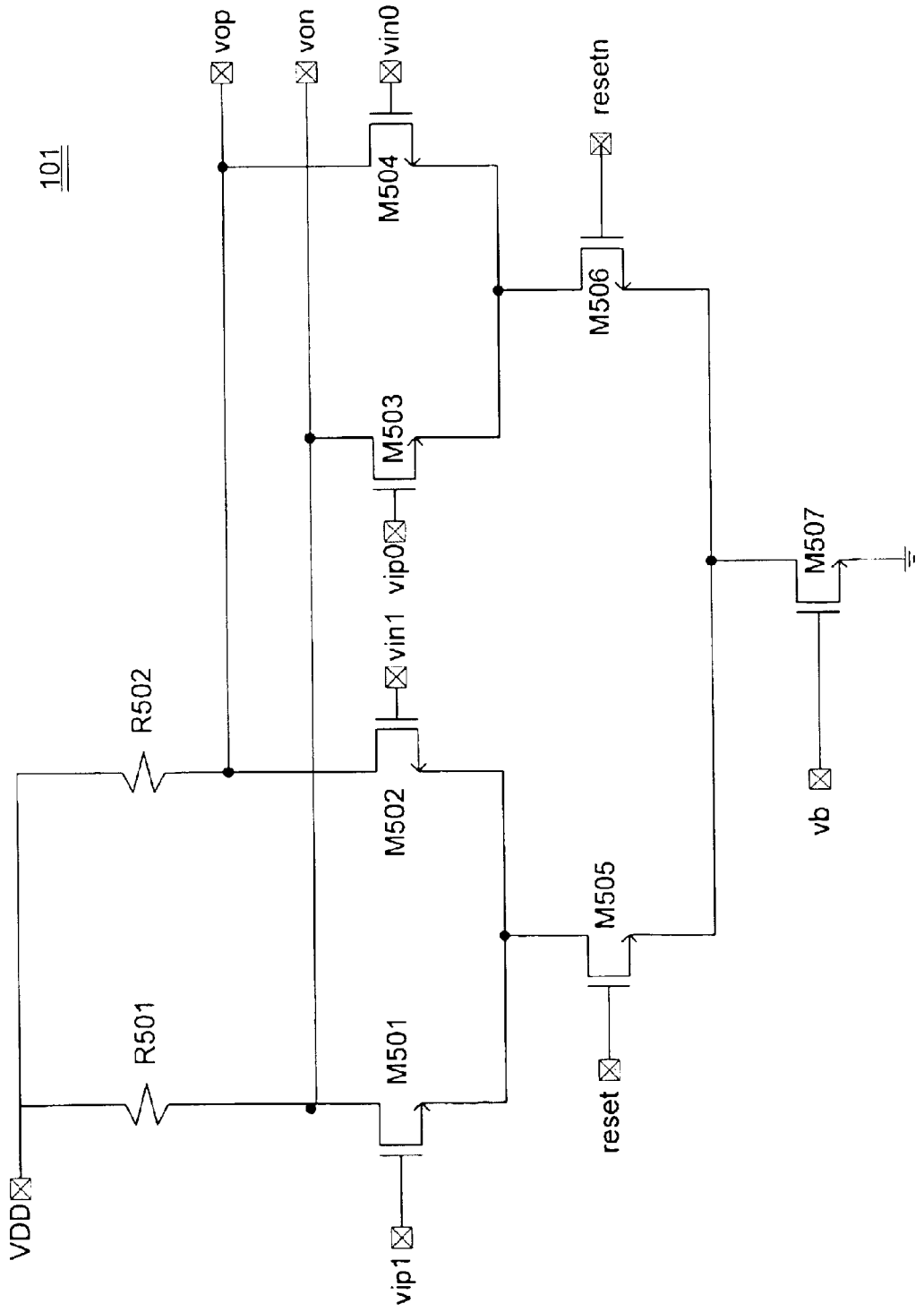
FIG. 5 illustrates a conventional CML multiplexer used in the circuit of FIG. 1.
Figure 6:
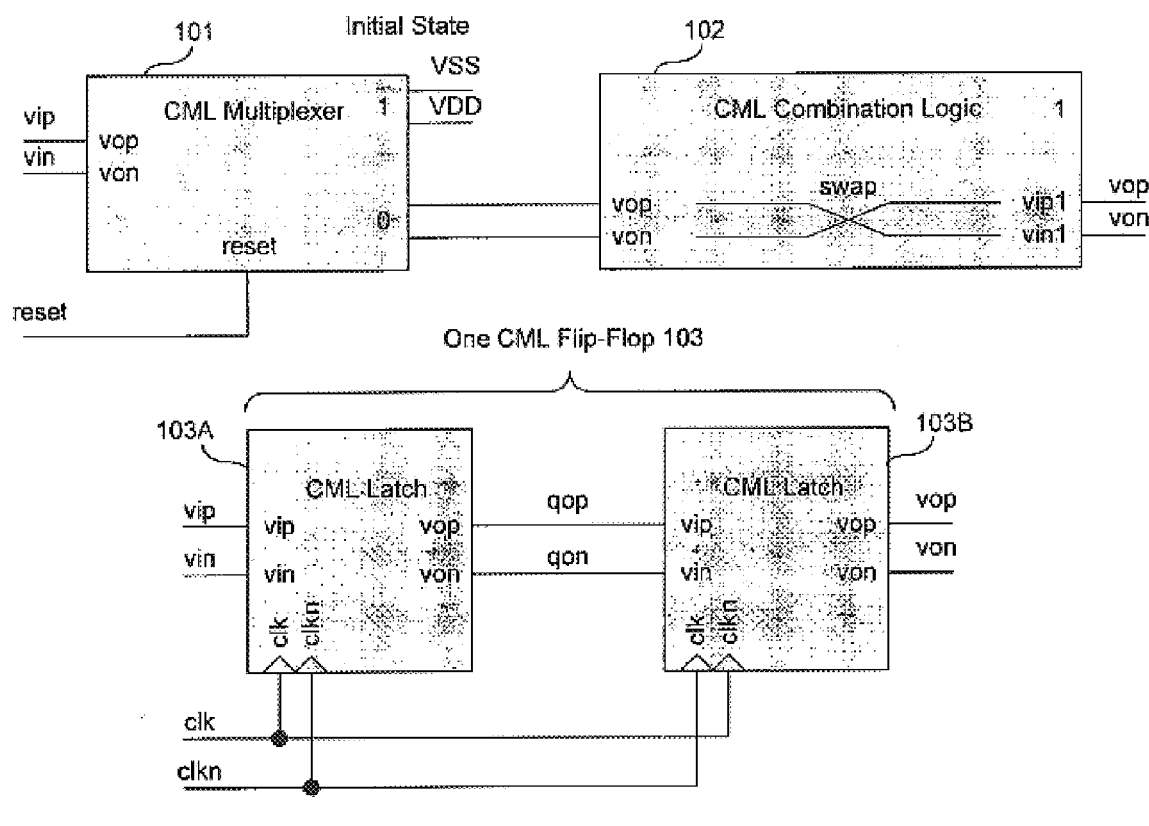
FIG. 6 illustrates a conventional CML divide-by-2 circuit.
Figure 7:
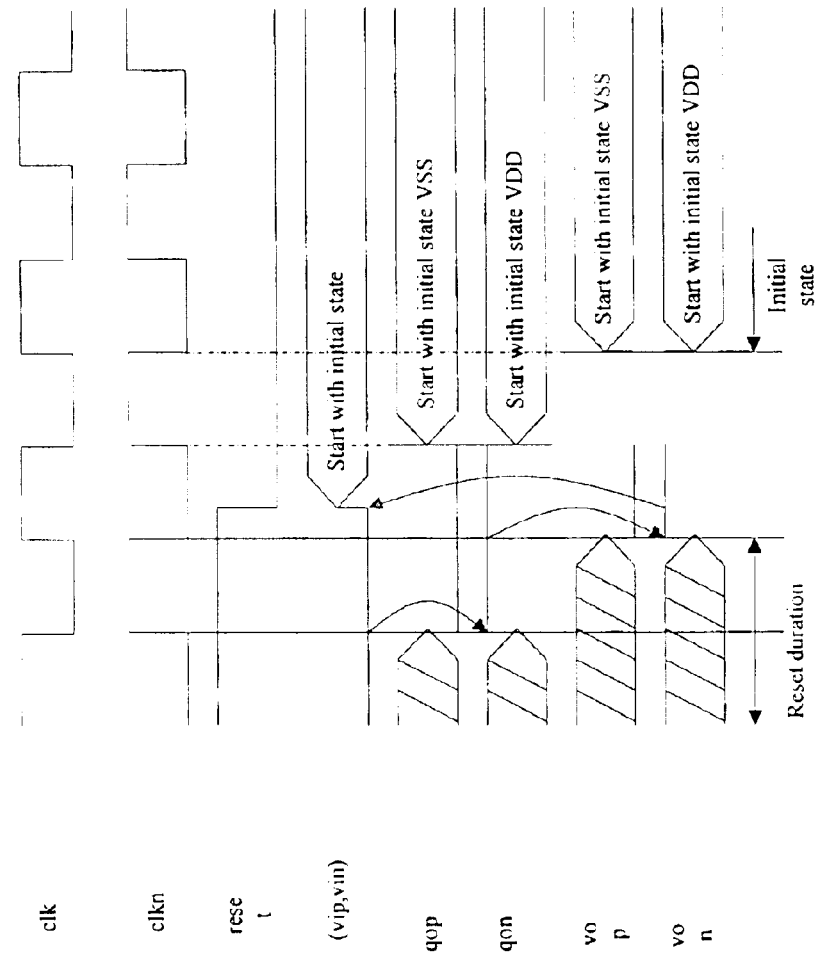
FIG. 7 illustrates a timing diagram of the conventional CML divide-by-2 circuit.
Figure 8:
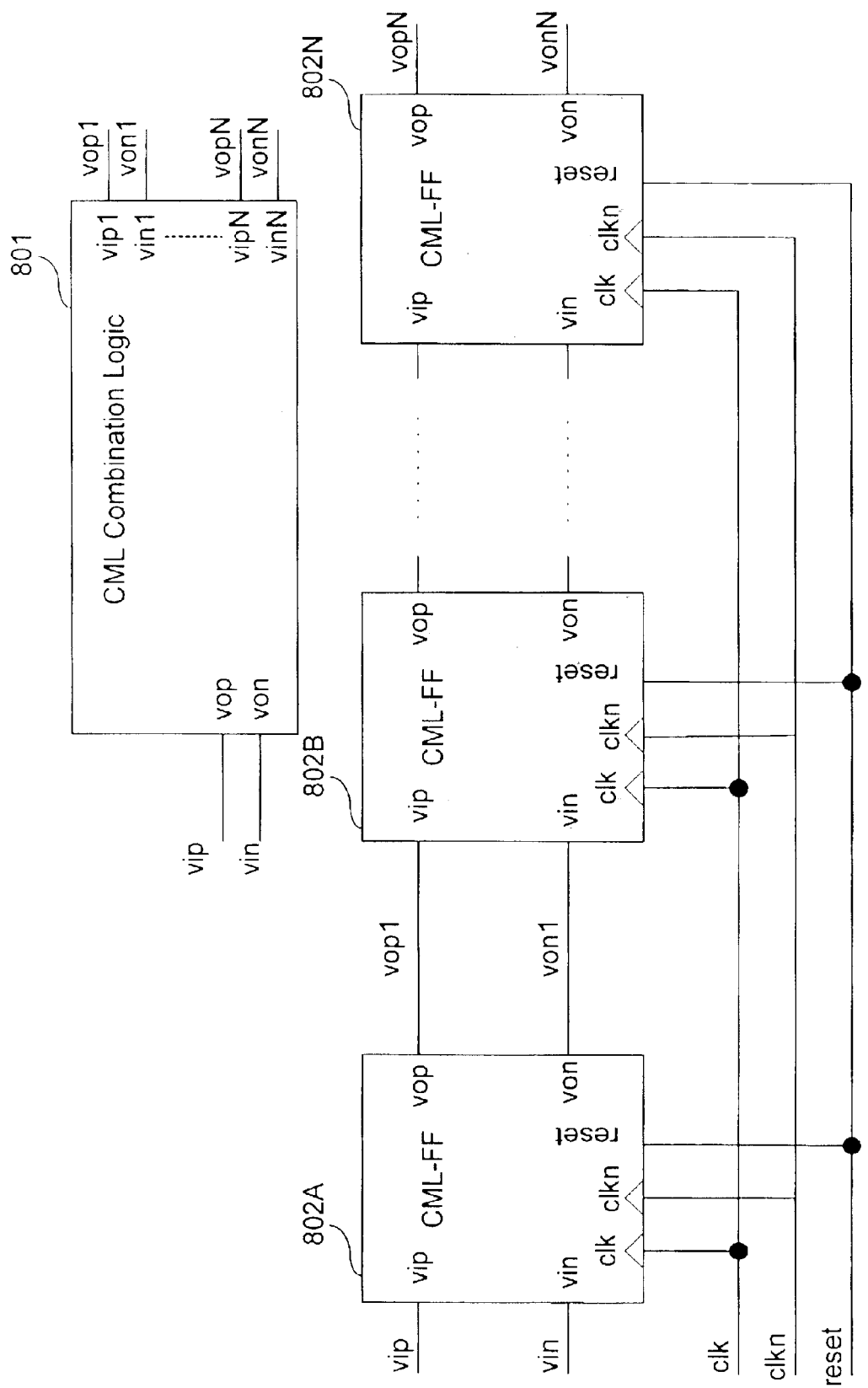
FIG. 8 illustrates a CML divide-by-N circuit with asynchronous reset of the present invention.

FIG. 8 illustrates a CML divide-by-N-circuit of the present invention. Comparing FIG. 8 with FIG. 1, multiplexer 101 is not needed in the divide-by-N-circuit of the present invention. The divide-by-N-circuit includes a plurality of CML flip flops 802A–802N connected in a series, and CML combination logic 801. CML flip flops 802A–802N are driven by (clk, clkn) clock inputs, and a reset signal. Outputs of the CML combination logic 801 and inputs to first CML flip flop 802A are (vip, vin) and outputs of the CML flip flops 802A–802N are (vop1, von1), . . .

Figure 9:
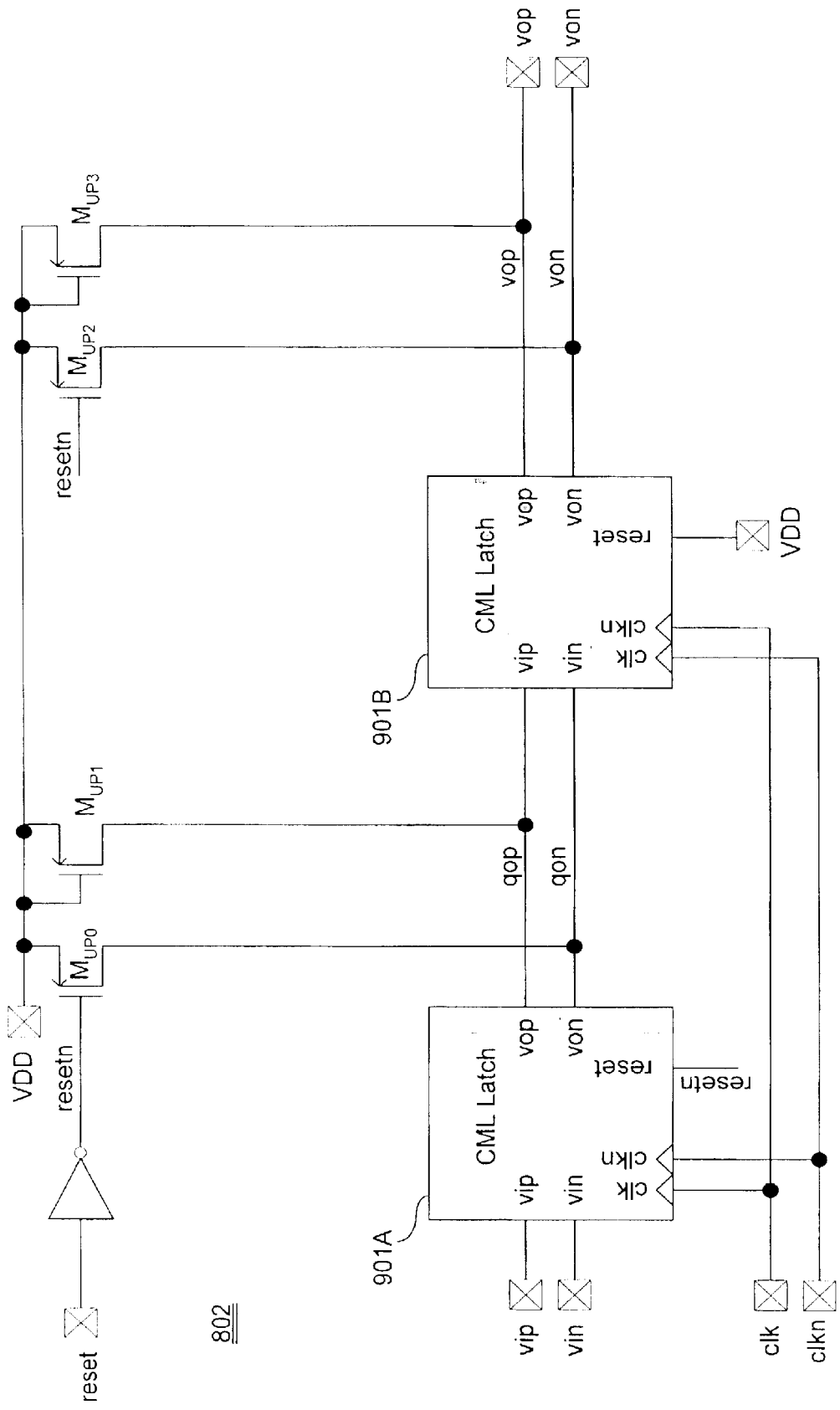
FIG. 9 illustrates a CML flip flop of the present invention with asynchronous reset.

FIG. 9 illustrates the structure of the single CML flip flop 802 of the present invention. As shown in FIG. 9, CML flip flop 802 includes two CML latches 901A, 901B connected in series, with inputs (vip, vin), and outputs (vop, von), as shown in FIG. 9. CML latches 901A, 901B are clocked by (clk, clkn). First CML latch 901A is reset by the inverted reset signal (resetn), and second CML latch 901B is reset by the supply voltage VDD. Four pull-up transistors $M_{UP0}$–$M_{UP3}$ are connected to outputs of first and second CML latches 901A, 901B, with pull-up transistors $M_{UP0}$, $M_{UP1}$ connected to outputs of the first CML latch 901A, and pull-up transistors $M_{UP2}$, $M_{UP3}$ connected to outputs of second CML latch 901B. Pull-up transistors $M_{UP0}$–$M_{UP3}$ pull up the outputs of the CML latches 901A, 901B (qop, qon), (vop, von) to the supply voltage (VSS, VDD). Pull-up transistors $M_{UP0}$ and $M_{UP2}$ are driven by the resetn signal (inverted reset signal) at their gates, and pull-up transistors $M_{UP1}$, $M_{UP3}$ are driven by the VDD supply voltage at their gates.

Pull-up PMOS transistors $M_{UP0-3}$ are placed at the outputs of latches 901A, 901B (qop, qon), (vop, von) in order to define their initial state. Pull-up transistors $M_{UP0-3}$ generate the small voltage spur during the reset and (see FIG. 10) the positive feedback NMOS cross-coupled transistor pairs M1003, M1004 of latches 901A, 901B accelerate the pull-up operation. The size of pull-up transistors $M_{UP0}$–$M_{UP3}$ can be very small.

Pull-up PMOS transistors $M_{UP0}$–$M_{UP3}$ replace the multiplexer 101 to provide the initial state (VSS, VDD), and the propagation delay of multiplexer 101 is no longer exists. As a result, operating speed that depends on $t_{setup}+t_{hold}$ can be pushed higher.

All pull-up PMOS transistors $M_{UP0}$–$M_{UP3}$ work only during the reset operation. Therefore, no additional current is consumed during the normal operation. The current consumption is reduced by $N \times I_{MUX}$ compared to conventional out circuit.

Figure 10:
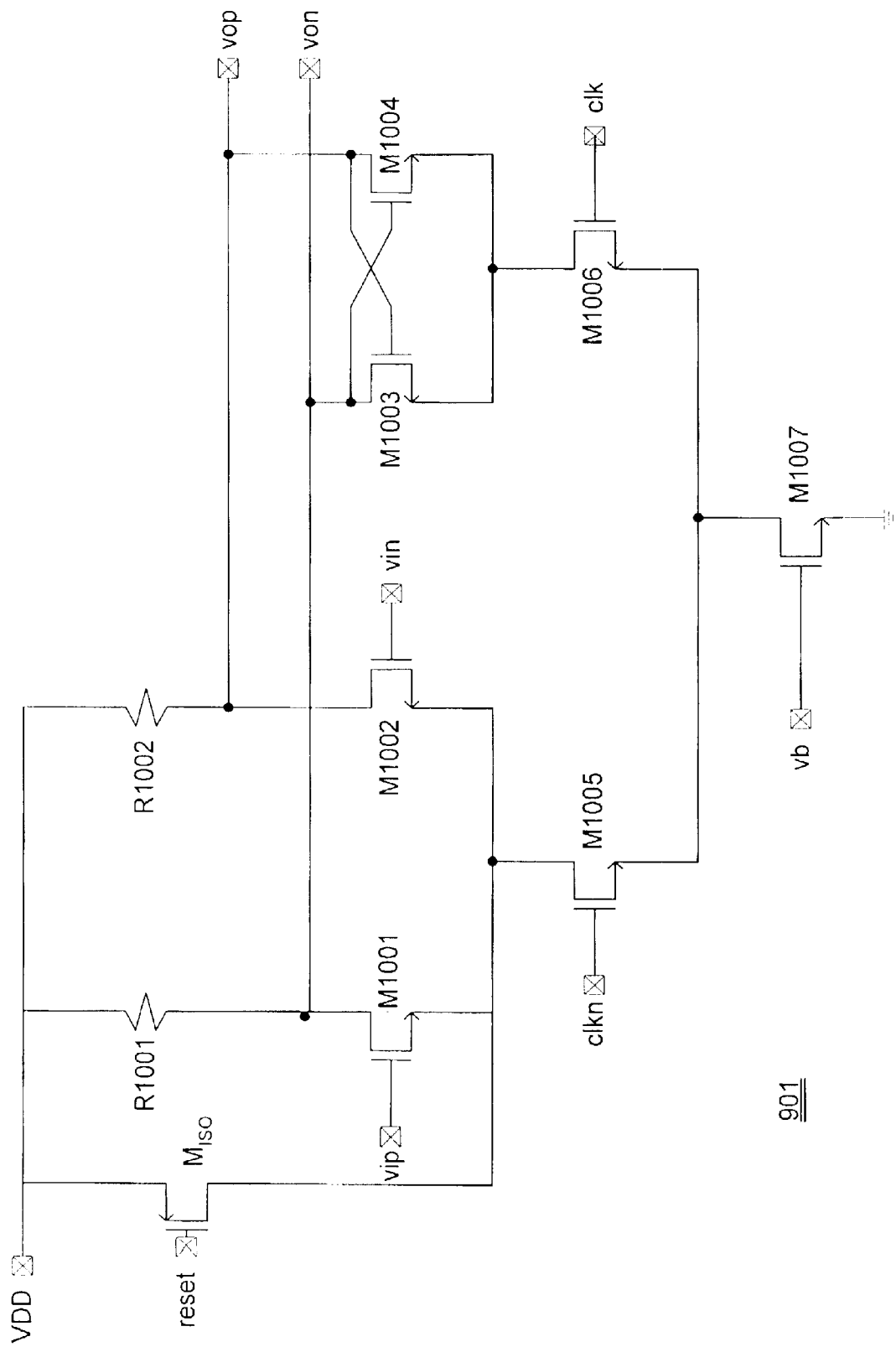
FIG. 10 illustrates a CML latch of the present invention.

FIG. 10 illustrates a circuit diagram of a CML latch 901 used in CML flip flop 802 of the present invention. As shown in FIG. 10, CML latch 901 has a differential transistor pair M1001, M1002, whose gates are driven by (vip, vin) respectively. CML latch 901 also has an NMOS cross-coupled transistor pair M1003, M1004. Drains of transistors M1001, M1002, M1003 and M1004 are tied to VDD through pull-up resistors R1001, R1002, as shown in FIG. 10. Sources of the differential transistor pair M1001, M1002 are tied to a switch transistor M1005, whose gate is driven by clock input clkn. Sources of cross coupled transistor pair M1003, M1004 are tied to a drain of transistor switch M1006, whose gate is driven by clock input clk. Current source transistor M1007, whose gate is biased by voltage vb, supplies current to sources of switch transistors M1005, M1006. Additionally, pull-up transistor $M_{ISO}$, driven by the reset signal, connect sources of differential pair M1001, M1002, to the supply voltage VDD. Latch 901 produces outputs (vop, von) as shown in FIG. 10. Pull-up PMOS transistor $M_{ISO}$ is placed at the virtual ground of NMOS differential transistor pair M1001, M1002 of first CML latch 901A in order to isolate the divide-by-N circuit from external signals during the reset. ($M_{ISO}$ may, alternatively, be a bipolar transistor.)

Thus, during reset, the input signal (vip, vin) is isolated by pull-up PMOS transistor $M_{ISO}$ located at the virtual ground of NMOS differential transistor pair M1001, M1002 (where their sources are connected) of first CML latch 901A in CML flip flop 802. It prevents an unknown input signal from interrupting the reset process. Since pull-up PMOS transistor $M_{ISO}$ is not placed at the signal path, the parasitic capacitance (e.g. 5.5 fF) of PMOS transistor $M_{ISO}$ does not degrade circuit performance.

Figure 11:
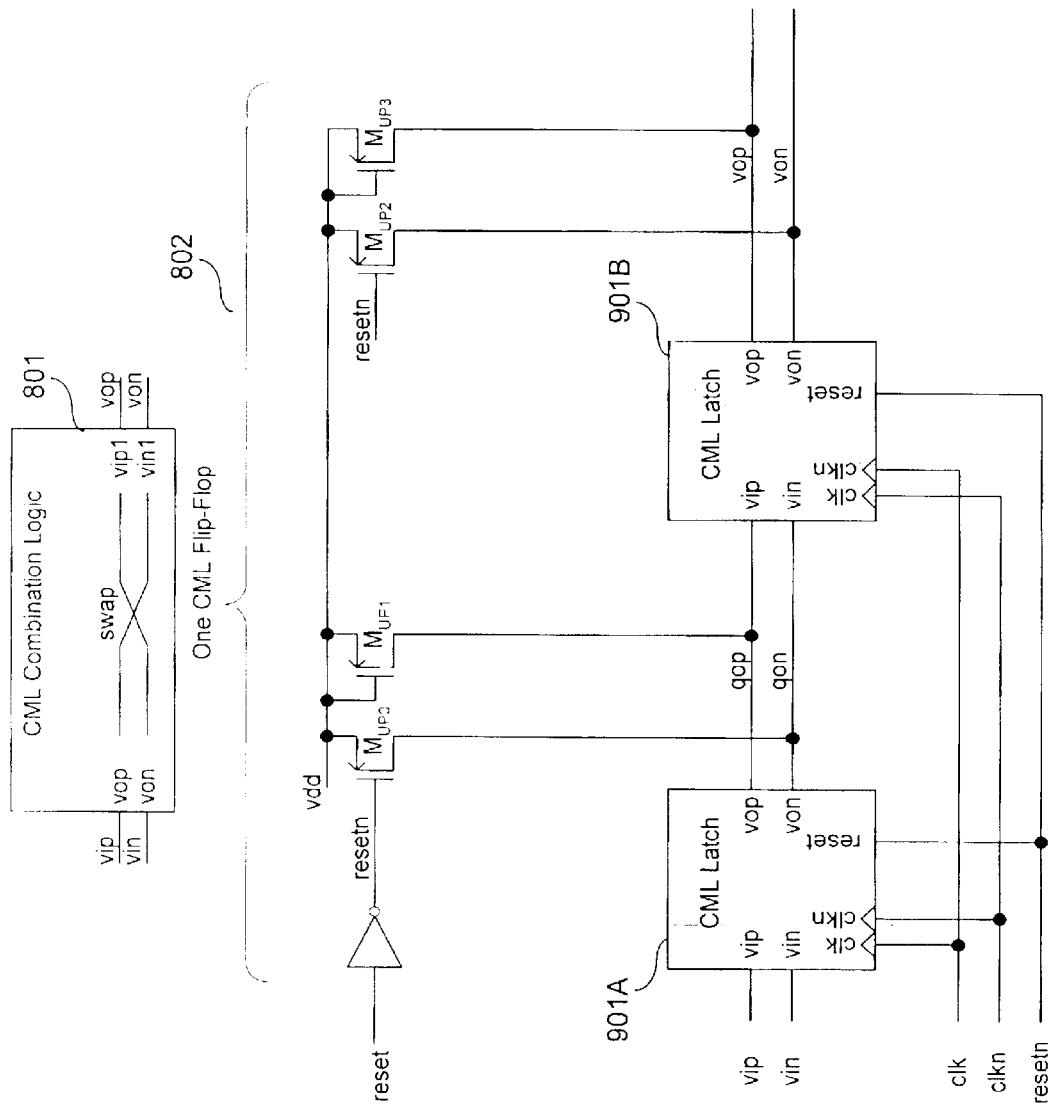
FIG. 11 illustrates a CML divide-by-2 circuit with asynchronous reset of the present invention.

FIG. 11 illustrates a divide-by-2 circuit utilizing the asynchronous reset of the present invention. As shown in FIG. 11, the single CML flip flop 802 is used to generate a divide-by-2. Note the pull-up transistors $M_{UP0}$–$M_{UP3}$ The asynchronous reset circuit described above is applicable to any CML circuit with a memory element that needs an initial state, examples of such circuits are those utilizing flip flops and latches where an initial state of the flip flop or latch needs to be defined.

Figure 19:
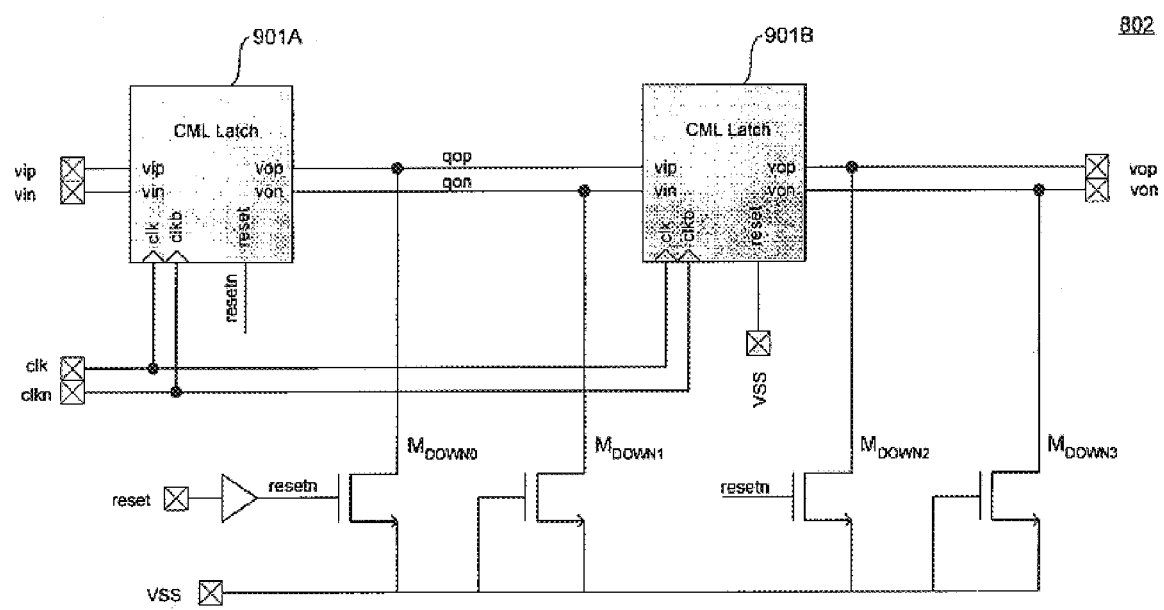
FIGS. 19–20 show the use of NMOS transistors in the circuit of FIG. 9.
Figure 20:
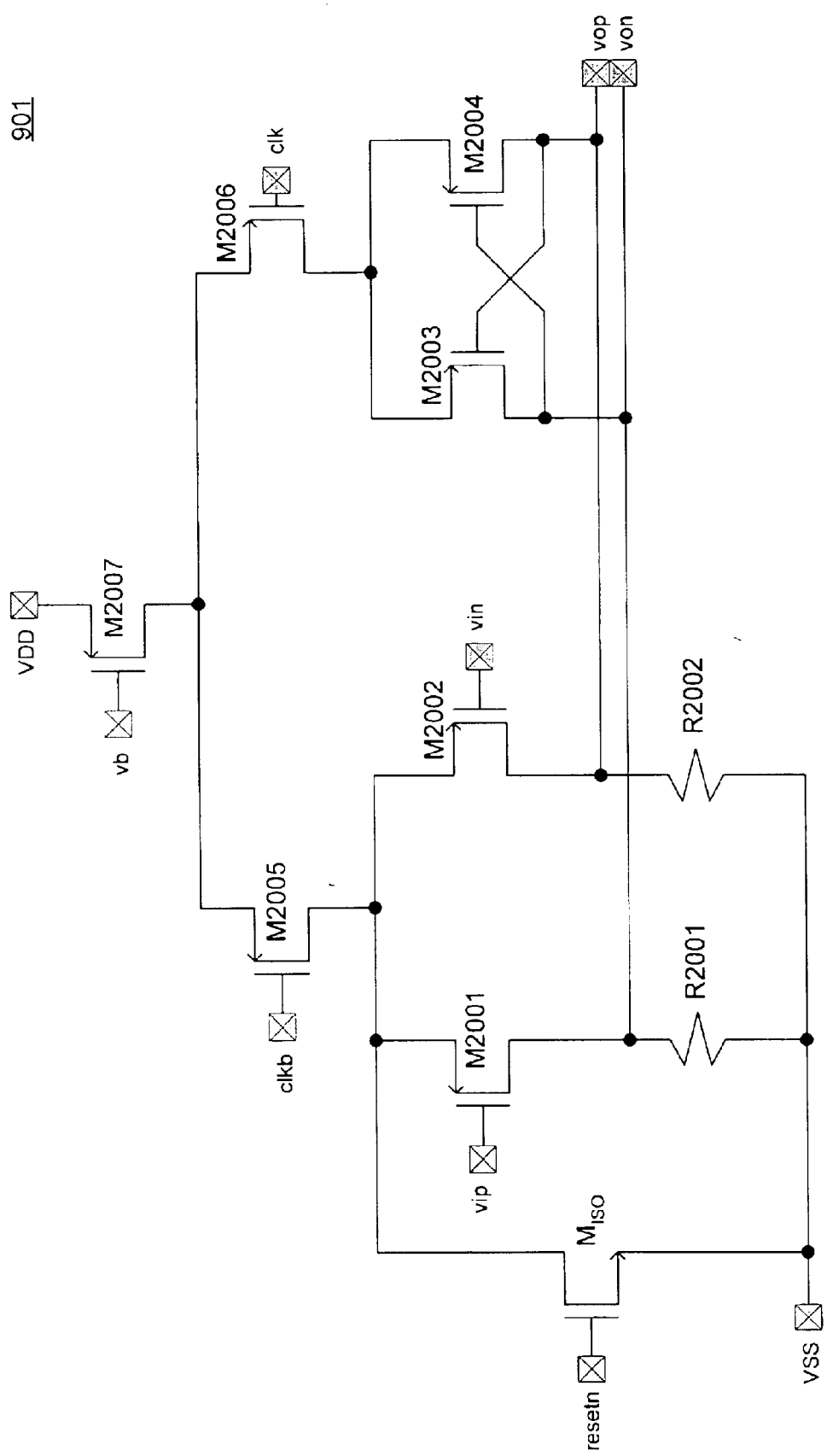
Figure 21:
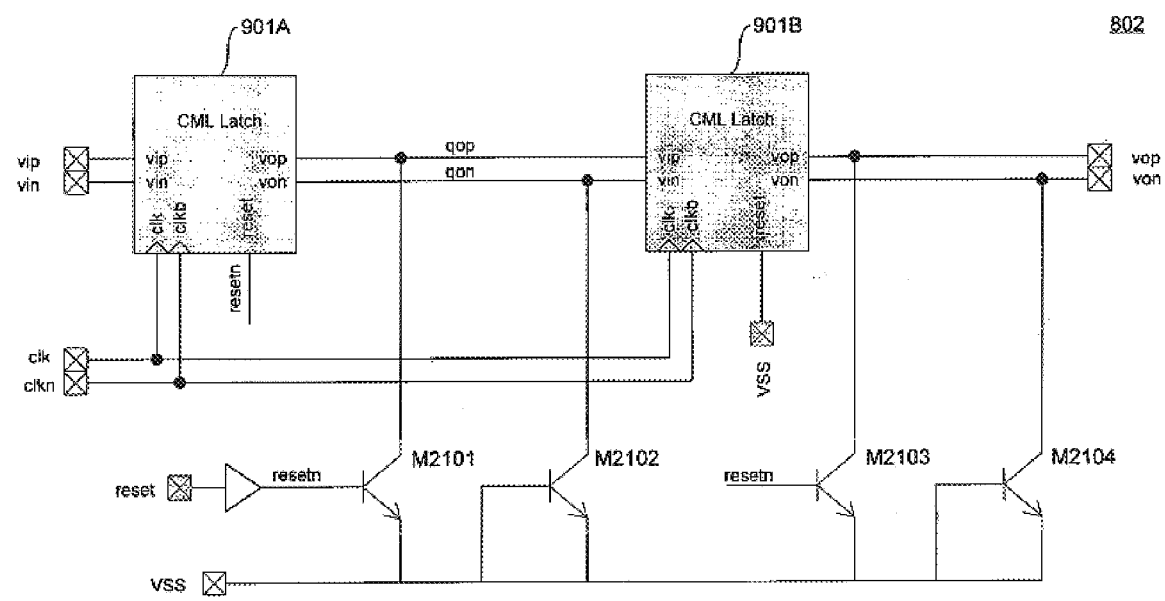
FIGS. 21–24 show the use of bipolar transistors in the circuit of FIG. 9.
Figure 22:
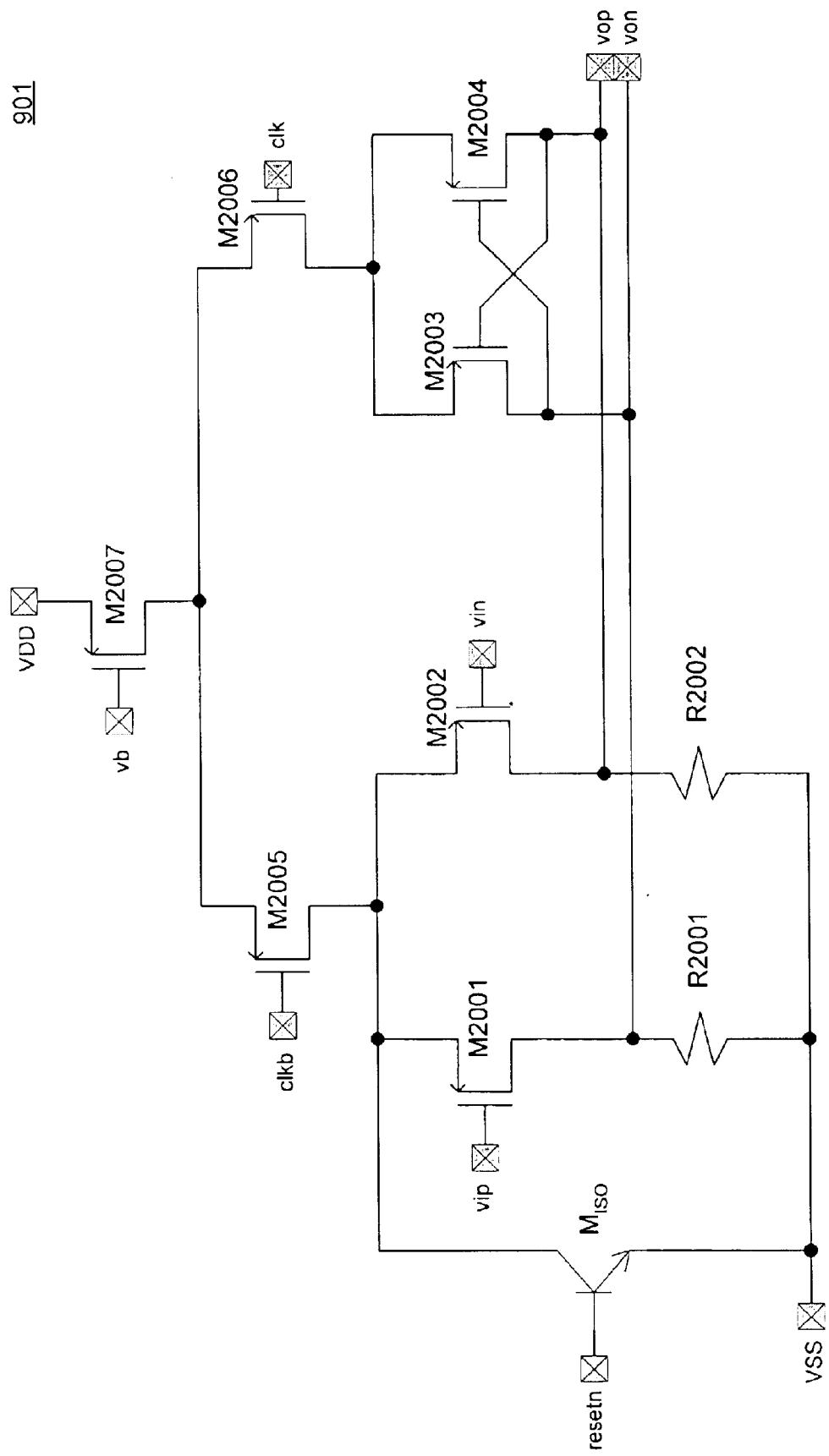
Figure 23:
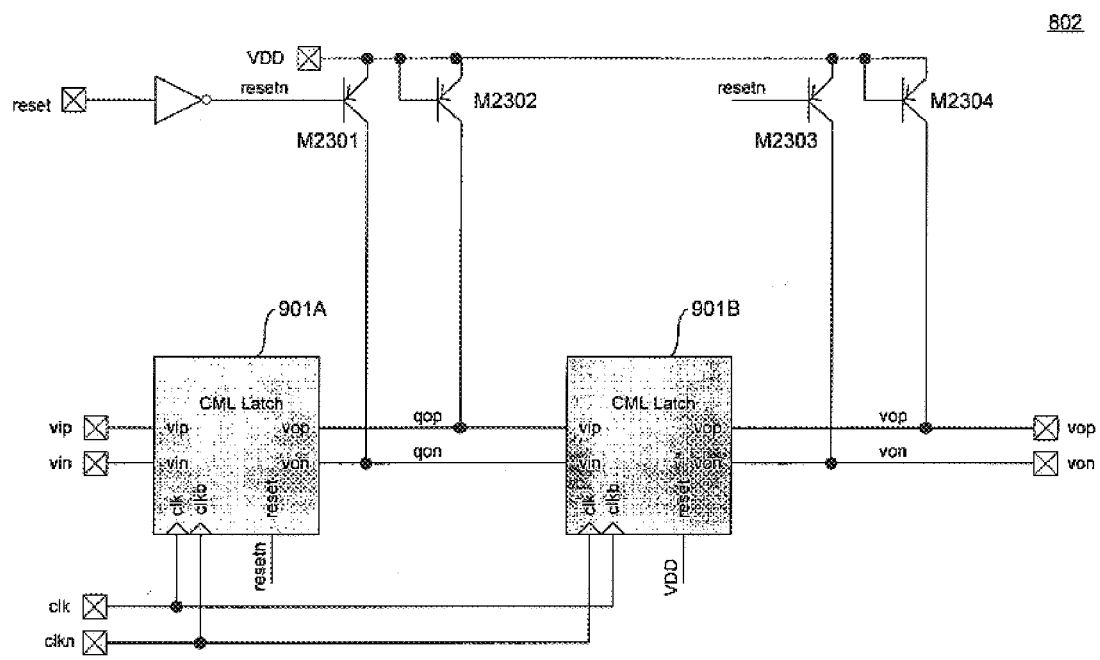
Figure 24:
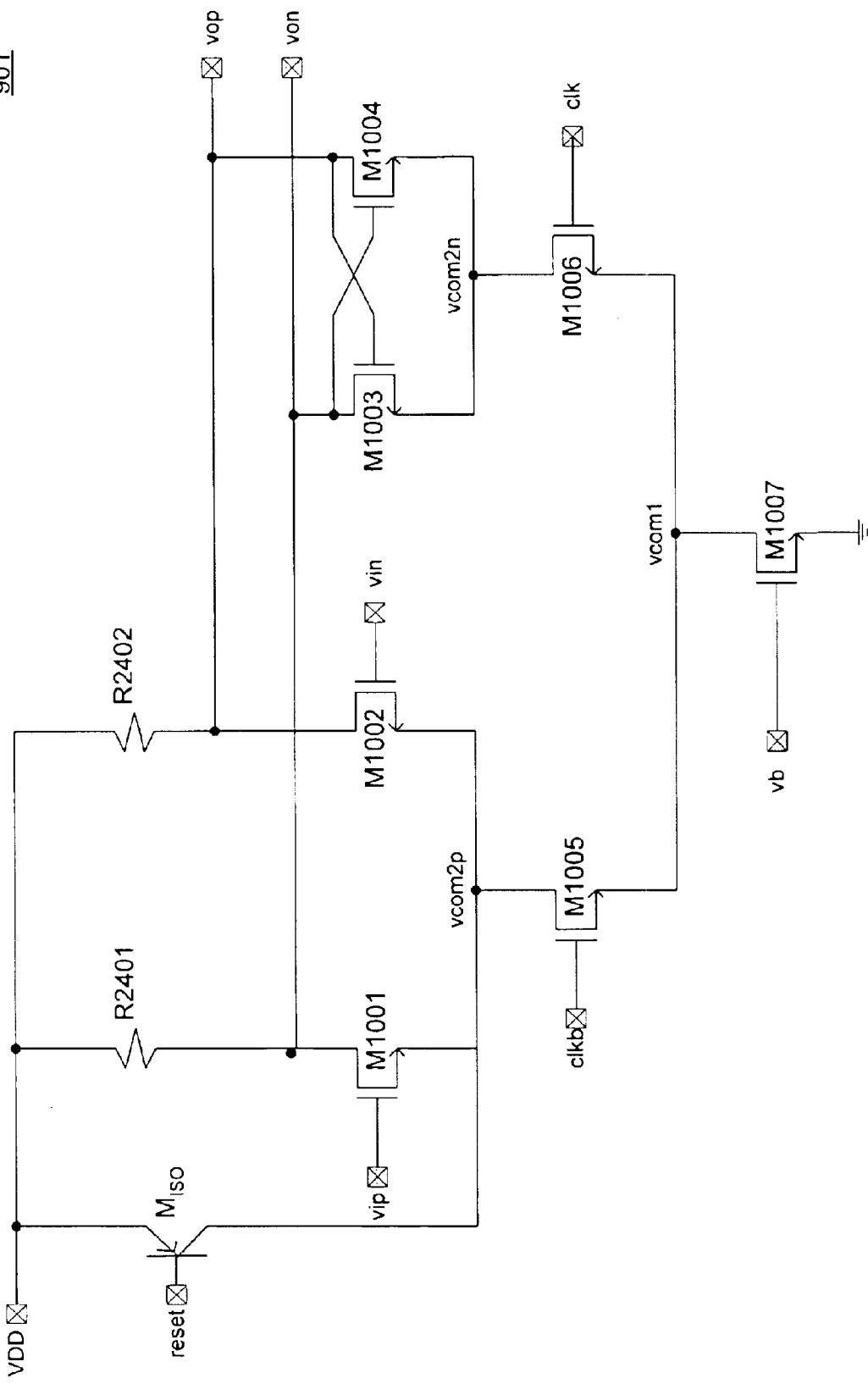

Pull-up transistors $M_{UP0}$ and $M_{UP2}$ may be used alone, without their complementary pull-up transistors $M_{UP1}$, $M_{UP3}$, as long as it is acceptable to have different duty cycles for the vop and von. (Note also that pull-up transistors $M_{UP0}$ and $M_{UP3}$ can be NMOS transistors, to pull outputs of the CML latches 901 down to LOW(rather than PMOS transistors, to pull the outputs to HIGH, see $M_{DOWN0}$–$M_{DOWN3}$ FIG. 19, see also NMOS isolation transistor $M_{ISO}$ in FIG. 20)). Alternatively, bipolar transistors may be used (see M2101–M2104 in FIG. 21 or M2301–M2304 in FIG. 23, see also binolar transistor $M_{ISO}$ in FIG. 22 and FIG. 24), or any device that can be used as a switch to pull the output of CML latches 901A, 901B to the supply voltage. Thus, $M_{UP1}$, $M_{UP3}$ may be thought of as "dummy transistors" and, used to match outputs loading of CML latch 901A, 901B, outputs and to ensure symmetrical duty cycles. Note also that in some applications, only a single transistor $M_{UP0}$ (of the four pull-up transistors $M_{UP0}$–$M_{UP3}$) may be used.

As with the pull-up transistors $M_{UP0}$–$M_{UP3}$, pull-up transistor $M_{ISO}$ may be replaced by a switching element to pull the node up to supply voltage VDD (or in some cases down to ground).

Furthermore, while the first CML latch 901A must have a pull-up transistor $M_{ISO}$, it is possible to use a conventional CML latch (i.e. without a pull-up transistor $M_{ISO}$) as the second latch of flip flop 802.

The minimum reset duration is less than half clock period if the reset is released at the negative clk period. It is very useful to reduce the latency if a low speed clock is used. For example, if clk is 1/20 of full speed clock, then the latency is reduced at least by 10 UI.

The sizes of pull-up PMOS transistors $M_{UP0-3}$ along the signal path are just big enough to provide the small voltage spur and then the NMOS cross-coupled transistor pairs of CML flip flops 802 accelerate the pull-up operation. Therefore, the parasitic capacitance due to each pull-up PMOS transistor $M_{UP0-3}$ and routing is roughly 1 fF. This is too small to affect circuit performance.

The reset operation is the same as in a conventional CML divide-by-N in that all CML flip flop 802 outputs are reset to the known value (VSS, VDD). The reset operation of a CML divide-by-2 circuit shown in FIG. 10 is explained using timing diagrams of FIGS. 12–15 below:

Case 1

Figure 12:
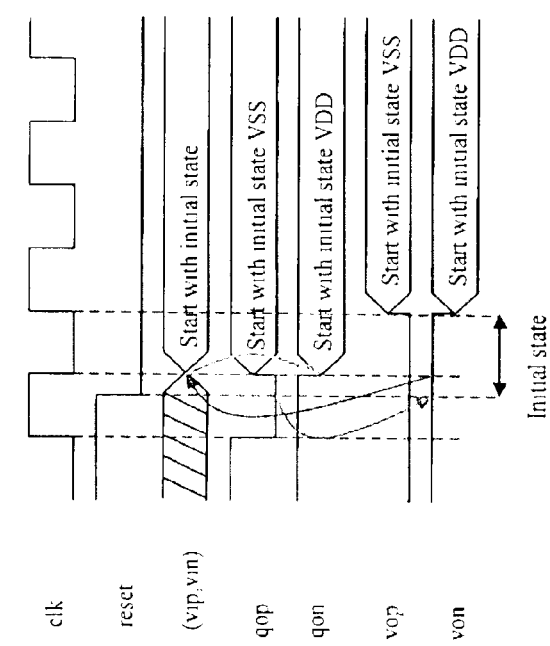

As shown in FIG. 12, the input (vip, vin) is isolated by pull-up PMOS transistor $M_{ISO}$ when the reset is on. When elk and reset are positive, the output (qop, qon) of first CML latch 901A is pulled up to (VSS, VDD) by pull-up PMOS transistors $M_{UP0-1}$ and, held and accelerated by NMOS cross-coupled transistor pair M1001, M1002 of first CML latch 901A. At the same time, it is amplified to the output (vop, von) of flip flop as (VSS, VDD). This is indicated by the lower downward arrow in FIG. 12.

When the reset is released at the positive clk period, the output (vop, von) of CML flip flop 802 is still (VSS, VDD). When clk is negative again, the initial state (VSS, VDD) of the flip flop output is held by NMOS cross-coupled transistor pair M1003, M1004 of second CML latch 901B. Its inverted flip flop output (VDD, VSS) through the combination logic 801 is asserted at the input (vip, vin) and read into CML flip flop 802. As a result, the divide-by-2-circuit starts running with the initial state. This is indicated by the upward arrow in FIG. 12.

Case 2

Figure 13:
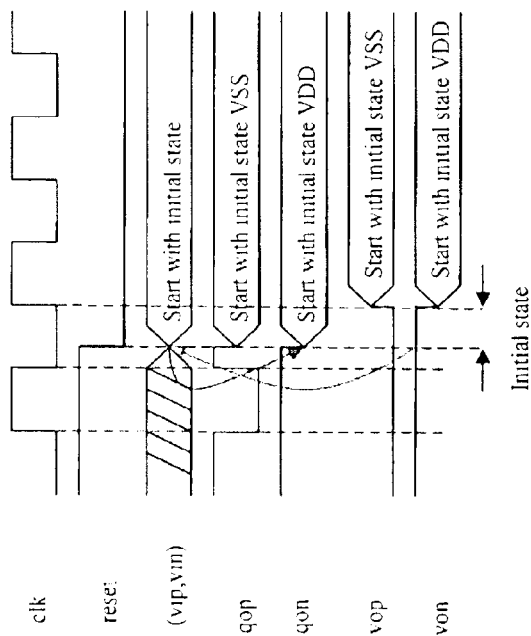
FIGS. 12–15 show timing diagrams of the reset operation of the circuit of FIG. 10.

As shown in FIG. 13, the input (vip, vin) is isolated by pull-up PMOS transistor $M_{ISO}$ when the reset is on. When clk is negative and reset is positive, the output (vop, von) of CML flip flop 802 is pulled up to (VSS, VDD) by pull-up PMOS transistors $M_{UP2-3}$ and, held and accelerated by NMOS cross-coupled transistor pair of second CML latch 901B. This is indicated by the upward arrow in FIG. 13.

When the reset is released at the negative clk period, the initial state (VDD, VSS) of inverted flip flop output through combination logic 801 is asserted at the input (vip, vin) and read into CML flip flop 802. As a result, the divide-by-2-circuit starts running with the initial state. This is indicated by the downward arrow in FIG. 13.

Case 3

Figure 14:
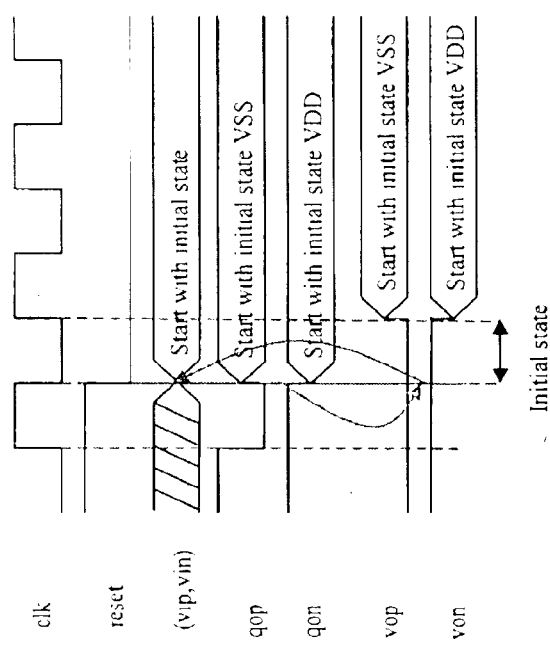

As shown in FIG. 14, the input (vip, vin) is isolated by pull-up PMOS transistor $M_{ISO}$ when the reset is on. When clk and reset are positive, the output (qop, qon) of first CML latch 901A is pulled up to (VSS, VDD) by pull-up PMOS transistors $M_{UP0}$–$M_{UP1}$, and held and accelerated by NMOS cross-coupled transistor pair M1001, M1002 of first CML latch 901A. At the same time, it is amplified to the output (vop, von) of flip flop as (VSS, VDD). This is indicated by the downward arrow in FIG. 14.

When the reset is released at the falling edge of clk, the initial state (VSS, VDD) of CML flip flop 802 output is held by NMOS cross-coupled transistor pair M1003, M1004 of second CML latch 901B. Its inverted flip flop output (VDD, VSS) appears at the input (vip, vin) through the combination logic and read into CML flip flop 802. As a result, the divide-by-2-circuit starts running with the initial state. This is indicated by the upward arrow in FIG. 14.

Case 4

Figure 15:
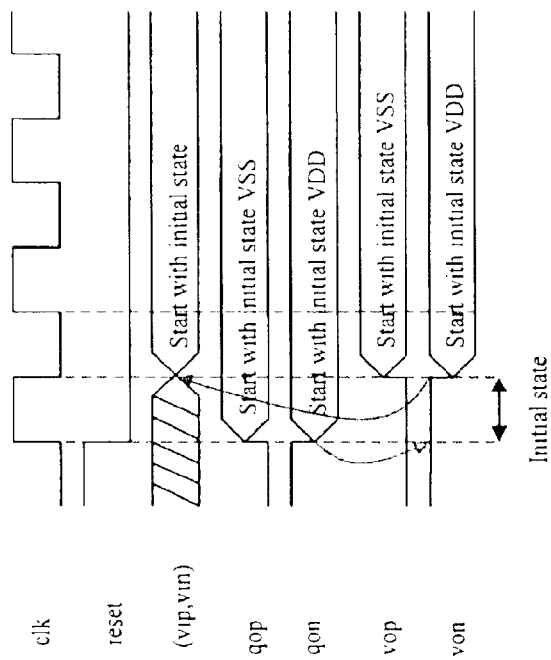

As shown in FIG. 15, the input (vip, vin) is isolated by pull-up PMOS transistor $M_{ISO}$ when the reset is on. When elk is negative and reset is positive, the output (vop, von) of flip flop is pulled up to (VSS, VDD) by pull-up PMOS transistors $M_{UP2}$–$M_{UP3}$, and is held and accelerated by NMOS cross-coupled transistor pair M1003, M1004 of second CML latch 901B.

When the reset is released at the rising edge of clk, the output (qop, qon) of first CML latch 901A is pulled up to (VSS, VDD) by pull-up PMOS transistors $M_{UP0-1}$ until the reset drops below the threshold voltage $V_{th}$ of $M_{UP0}$. Although the output (qop, qon) cannot reach the value (VSS, VDD) at the end of reset, the output (qop, qon) is kept pulling up to (VSS, VDD) by the positive-feedback NMOS cross-coupled transistor pair M1003, M1004 of first CML latch 901A and amplified to the output (vop, von) of CML flip flop 802 as (VSS, VDD). This is indicated by the downward arrow.

When clk is negative again, the initial state (VSS, VDD) of CML flip flop 802 output is held by NMOS cross-coupled transistor pair M1003, M1004 of second CML latch 901B. Its inverted flip flop output (VDD, VSS) is asserted at the input (vip, vin) through combination logic 801, and is read into CML flip flop 802. As a result, the divide-by-2 circuit starts running with the initial state. This is indicated by the upward arrow in FIG. 15.

Thus, in FIGS. 12–15, the case illustrated in FIG. 13 show the shortest reset time, and the case illustrated in FIG. 12 shows the longest reset time.

Unlike conventional CML divide-by-N, the reset in the circuits illustrated in FIGS. 8–11 is done asynchronously but not sequentially. The minimum reset duration can be less than the half of clock period if the reset is released at the negative clock period. It shortens the latency by 50%.

Figure 16:
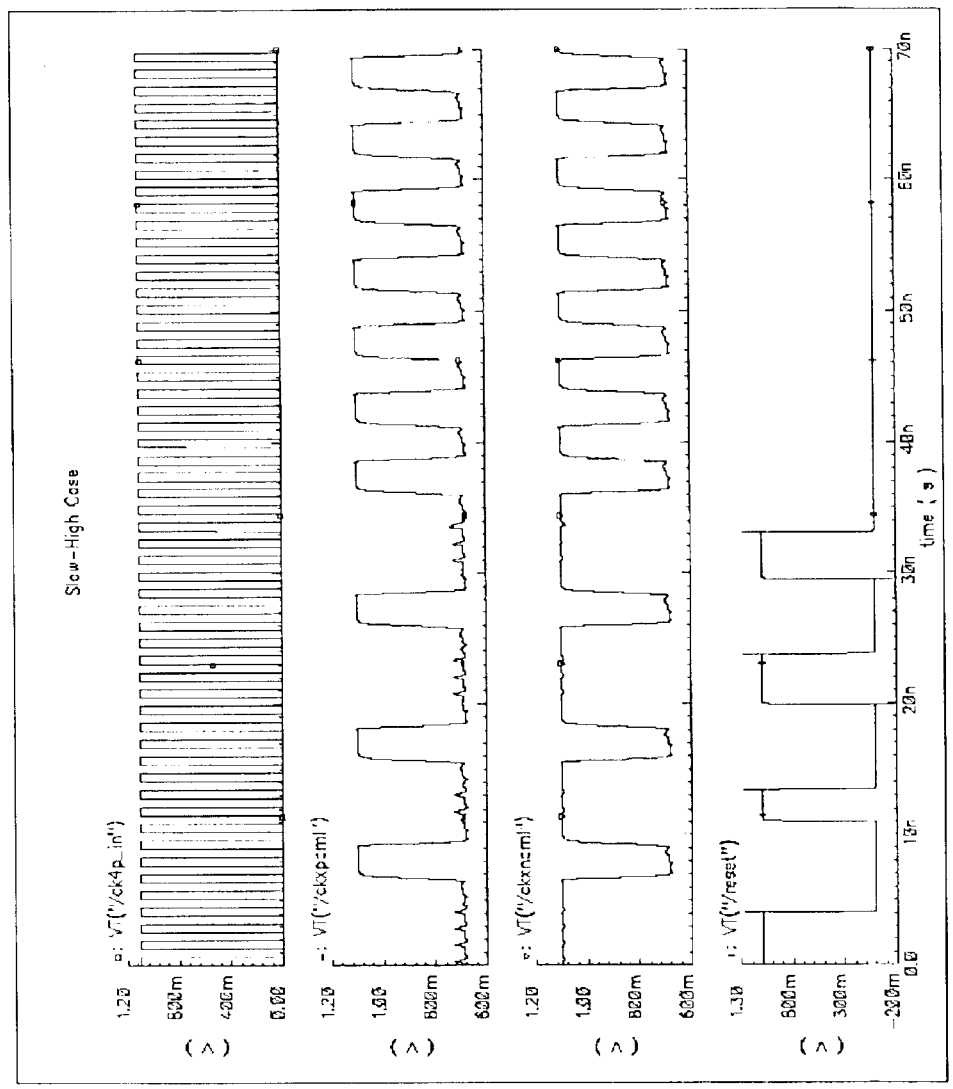
FIGS. 16–18 show voltage waveforms as a function of time for a CML divide-by-4 circuit that uses the asynchronous reset circuit of the present invention.
Figure 17:
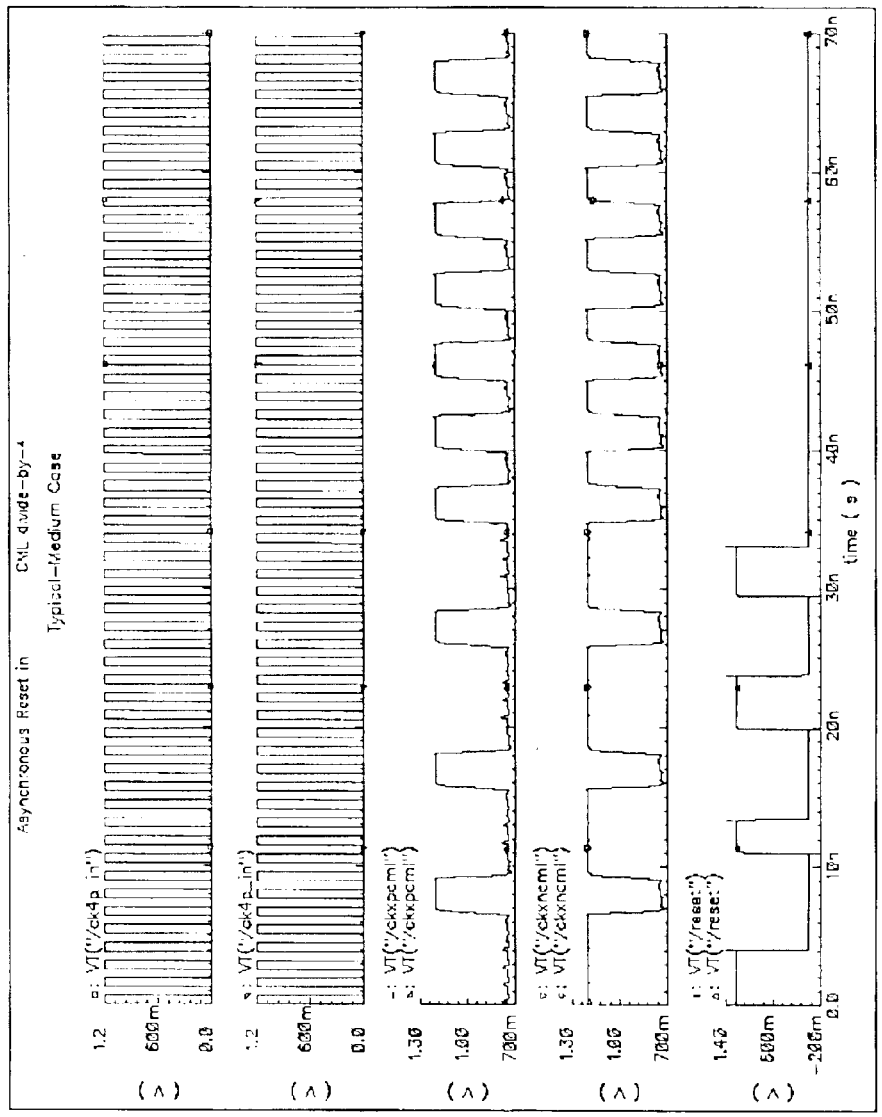
Figure 18:
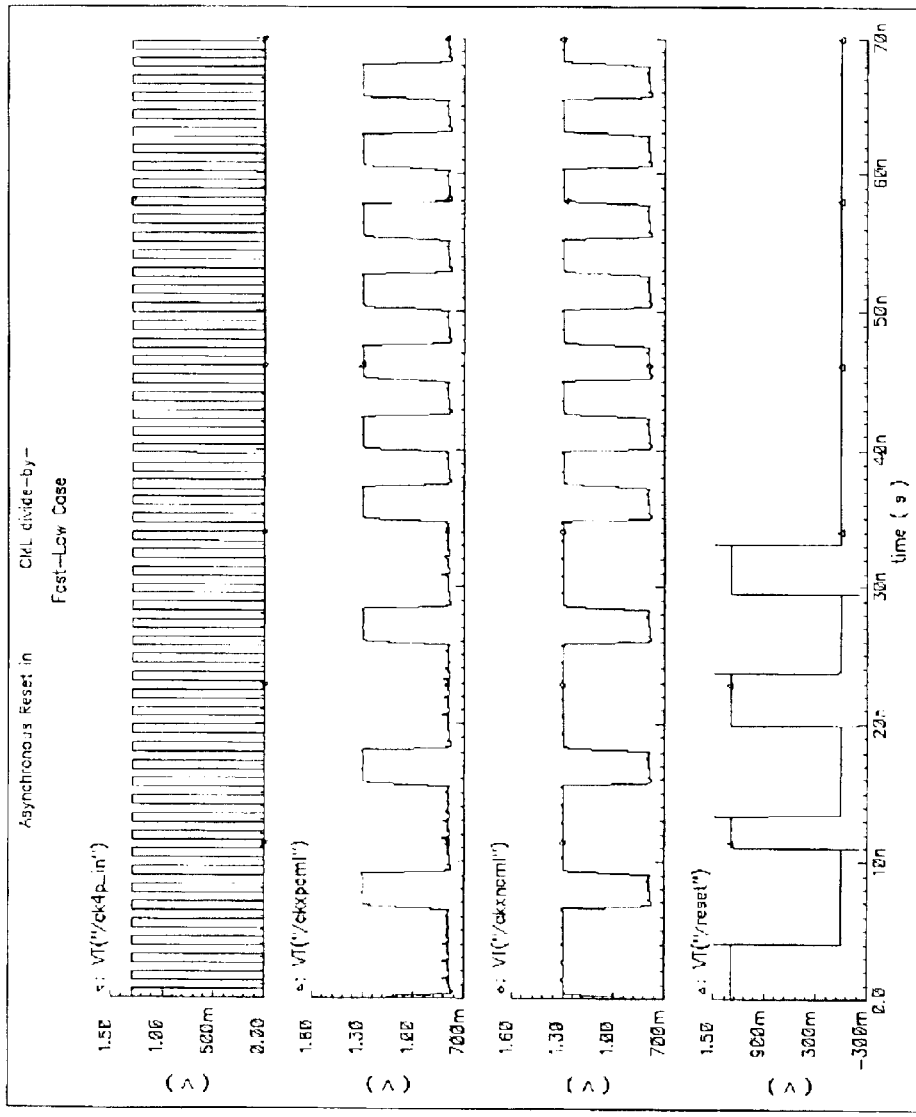

Simulation graphs are plotted in FIG. 16 for Slow-High and 1.1 V, FIG. 17 for Typical-Medium and 1.2 V, FIG. 18 for Fast-Low and 1.3V. Note that in FIGS. 16–18, VT(ck4p_in) is the input clock, VT(ckxpcml) & VT(ckxncml) are the differential output, VT(reset) is the reset signal.

Considering FIG. 16, the divide-by-4 is simulated with N=2 in the circuit of FIG. 8. Here, VT(ckxpcml) corresponds to vop2, VT(ckxncml) corresponds to von2 and VT(reset) corresponds to reset. VT(reset) has 4 pulses in order to simulate the four possible cases of FIGS. 12–15. It is observed that, when VT(reset) is on, the initial states of VT(ckxpcml) & VT(ckxncml) are 0 and 1 respectively. This corresponds to the cases shown in FIGS. 12–15.

FIGS. 16–17 show the simulation results under different simulation conditions, e.g., different temperatures, VDD, and so on. These figures confirm that the asynchronous reset of the invention works properly.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A current mode logic (CML) flip flop comprising:

a first CML latch and a second CML latch; and a plurality of pull-up switches responsive to a reset signal, wherein outputs of the first and second CML latches are pulled up to a supply voltage through the pull-up switches, and wherein the first CML latch includes a first pull-up isolation switch driven by the reset signal for resetting the latch.

2. The CML flip flop of claim 1, wherein the second CML latch includes a second pull-up isolation switch driven by the reset signal for resetting the latch.

3. The CML flip flop of claim 1, wherein the pull-up switches are PMOS transistors connected to a positive supply through corresponding resistors.

4. The CML flip flop of claim 1, wherein the pull-up switches are NMOS transistors connected to a negative supply.

5. The CML flip flop of claim 1, wherein the first pull-up isolation switch is a PMOS transistor.

6. The CML flip flop of claim 1, wherein the first pull-up isolation switch is a bipolar transistor.

7. The CML flip flop of claim 1, wherein the first pull-up isolation switch isolates an external input to interrupt the resetting of the latch.

8. A CML divide-by-N circuit comprising:

N CML flip flops connected in series, each flip flop inputting (vip, vin) signals and outputting (vop, von) signals, and each flip flop including:

a first CML latch and a second CML latch, wherein the first CML latch includes a first pull-up isolation switch driven by the reset signal for resetting the latch;

a plurality of pull-up switches driven by a reset signal, wherein outputs of the first and second CML latches are pulled up to a supply voltage through the pull-up switches; and combination logic inputting the (vip, vin) signals and outputting the (vop, von) signals to set a duty cycle of the divide-by-N circuit.

9. The CML divide-by-N circuit of claim 8, wherein the second CML latch includes a second pull-up isolation switch driven by the reset signal for resetting the latch.

10. The CML divide-by-N circuit of claim 8, wherein the pull-up switches are PMOS transistors connected to a positive supply.

11. The CML divide-by-N circuit of claim 8, wherein the pull-up switches are NMOS transistors connected to a negative supply.

12. The CML divide-by-N circuit of claim 8, wherein the first pull-up isolation switch is a PMOS transistor.

13. The CML divide-by-N circuit of claim 8, wherein the first pull-up isolation switch is a bipolar transistor.

14. The CML flip flop of claim 8, wherein the first pull-up isolation switch isolates an external input to interrupt the resetting of the latch.

15. A current mode logic (CML) flip flop comprising:

a first CML latch and a second CML latch; and at least one output pull-up switch driven by a reset signal, wherein at least one of outputs of the first and second CML latches is pulled up to a supply voltage through the at least one output pull-up switch, and wherein the first CML latch includes a first pull-up isolation switch driven by the reset signal for resetting the latch.

16. A current mode logic (CML) flip flop comprising:

a first CML latch and a second CML latch; and at least one output pull-down switch driven by a reset signal, wherein at least one of outputs of the first and second CML latches is pulled down to a supply voltage through the at least one output pull-down switch, and wherein the first CML latch includes a first pull-up isolation switch driven by the reset signal for resetting the latch.

* * * * *